United States Patent
Kodama

(10) Patent No.: US 7,592,399 B2
(45) Date of Patent: Sep. 22, 2009

(54) EPOXY/SILICONE HYBRID RESIN COMPOSITION AND OPTICAL SEMICONDUCTOR DEVICE

(75) Inventor: Kinya Kodama, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 432 days.

(21) Appl. No.: 11/640,182

(22) Filed: Dec. 18, 2006

(65) Prior Publication Data

US 2007/0142574 A1  Jun. 21, 2007

(30) Foreign Application Priority Data

Dec. 19, 2005 (JP) .............................. 2005-364404

(51) Int. Cl.
  *C08L 83/05* (2006.01)
  *C08L 83/06* (2006.01)
  *H01L 23/29* (2006.01)
(52) U.S. Cl. ....................................... 525/476; 257/791
(58) Field of Classification Search ........................ None
  See application file for complete search history.

(56) References Cited

U.S. PATENT DOCUMENTS

| 4,335,367 | A  | * | 6/1982  | Mitsui et al. ............... 336/205 |
| 2005/0129957 | A1 | * | 6/2005  | Kashiwagi et al. .......... 428/413 |
| 2005/0154170 | A1 | * | 7/2005  | Klaassens et al. ............. 528/27 |
| 2005/0244649 | A1 | * | 11/2005 | Kashiwagi et al. .......... 428/413 |
| 2006/0205237 | A1 | * | 9/2006  | Kodama et al. ............. 438/790 |
| 2007/0142573 | A1 | * | 6/2007  | Kodama ..................... 525/476 |

FOREIGN PATENT DOCUMENTS

JP    2005-158766 A    6/2005

* cited by examiner

*Primary Examiner*—Robert Sellers
(74) *Attorney, Agent, or Firm*—Birch Stewart Kolasch & Birch, LLP

(57) ABSTRACT

An epoxy/silicone hybrid resin composition is provided comprising (A) an organosilicon compound having at least one silicon-bonded hydroxyl group, (B) a modified epoxy resin which is free of a phenylene ether skeleton and has reactive hydroxyl groups wherein some or all of the hydrogen atoms of the reactive hydroxyl groups are substituted by monovalent hydrocarbon groups or silyl groups, and (C) an aluminum base curing catalyst. The compatibility between silicone and epoxy resins is improved without a need for compatibilizing agent.

6 Claims, 2 Drawing Sheets

EPOXY/SILICONE HYBRID RESIN COMPOSITION AND OPTICAL SEMICONDUCTOR DEVICE

CROSS-REFERENCE TO RELATED APPLICATION

This non-provisional application claims priority under 35 U.S.C. §119(a) on Patent Application No. 2005-364404 filed in Japan on Dec. 19, 2005, the entire contents of which are hereby incorporated by reference.

TECHNICAL FIELD

This invention relates to epoxy/silicone hybrid resin compositions which form cured products free from dust deposition on their surface and having a low elasticity, crack resistance and good adhesion, and are suited as protective encapsulants for optical semiconductor members, and optical semiconductor devices comprising optical semiconductor members encapsulated therewith.

BACKGROUND ART

Blends of silicone resins and epoxy resins have a tendency that the compatibility between silicone resins and epoxy resins becomes worse as the molecular weights of the resins increase. As the compatibility becomes worse, the amount of a low-viscosity compatibilizing agent must be increased. As a consequence, resin blends become lower in viscosity, which may have impacts on the operation to mold into cured parts and the cured properties. Depending on the amount of compatibilizing agent, effects like brittleness improvement which are essentially expected from the incorporation of high molecular weight polymers are lost in some cases. Thus it would be desirable to have means of enhancing the compatibility between silicone resins and epoxy resins without resorting to compatibilizing agents.

Reference should be made to JP-A 2005-158766 corresponding to US 2005/0129957.

DISCLOSURE OF THE INVENTION

In view of the fact that an epoxy resin and a silicone resin, especially of high molecular weight, are inherently less compatible, an object of the invention is to provide an epoxy/silicone hybrid resin composition which is uniformly dissolvable without a need for compatibilizing agent and is suited as an optical semiconductor member encapsulating material having impact resistance and light transmission; and an optical semiconductor device, typically a light-emitting semiconductor device with an increased emission efficacy in which a light-emitting semiconductor member is encapsulated with the resin composition.

The inventor has found that when an epoxy resin free of a phenylene ether skeleton and having reactive hydroxyl groups is modified such that some or all of the hydrogen atoms of the reactive hydroxyl groups are substituted by monovalent hydrocarbon groups or silyl groups, the modified epoxy resin becomes compatible with an organosilicon compound having at least one silicon-bonded hydroxyl group per molecule to such an extent as to eliminate a need for compatibilizing agent; and that an epoxy/silicone hybrid resin composition comprising the organosilicon compound, the modified epoxy resin, and an aluminum base curing catalyst is suited for the encapsulation of optical semiconductor members, especially light-emitting semiconductor members.

The inventor has also found that when an organosilicon compound having at least one group containing a multiple bond capable of participating in hydrosilylation reaction and at least one silicon-bonded hydroxyl group per molecule is used as the organosilicon compound, and an organohydrogenpolysiloxane and a platinum group metal-based catalyst are further added, there is obtained an epoxy/silicone hybrid resin composition which utilizes both curing reaction by hydrosilylation and curing reaction of epoxy resin and in which the epoxy resin and the organosilicon compound are more compatible; and that when an optical semiconductor member is encapsulated with the composition in the cured state to produce an optical semiconductor device, the cured composition has a low elasticity, transparency, good adhesion, and no surface tack.

Accordingly, the invention provides an epoxy/silicone hybrid resin composition comprising as essential components (A) an organosilicon compound having at least one silicon-bonded hydroxyl group per molecule, (B) a modified epoxy resin which is free of a phenylene ether skeleton and has reactive hydroxyl groups wherein some or all of the hydrogen atoms of the reactive hydroxyl groups are substituted by substituted or unsubstituted monovalent hydrocarbon groups or silyl groups, and (C) an aluminum base curing catalyst.

Another embodiment of the invention is an optical semiconductor device in which an optical semiconductor member is encapsulated with a transparent cured product of the epoxy/silicone hybrid resin composition.

BENEFITS OF THE INVENTION

Since the epoxy/silicone hybrid resin composition is designed to improve the compatibility between silicone and epoxy resins without a need for compatibilizing agent, the composition can be prepared in any desired state ranging from a low viscosity to a high viscosity so that the composition is applicable by a variety of molding techniques including dispensing, potting, compression and transfer molding. When an optical semiconductor device is encapsulated with a cured product of the epoxy/silicone hybrid resin composition, the cured composition experiences little discoloration in a heat test. Particularly a light-emitting semiconductor device has the advantages of a high emission efficacy, a long lifetime, and energy saving. The invention is of great interest in the industry.

DESCRIPTION OF THE PREFERRED EMBODIMENT

Figure 1:
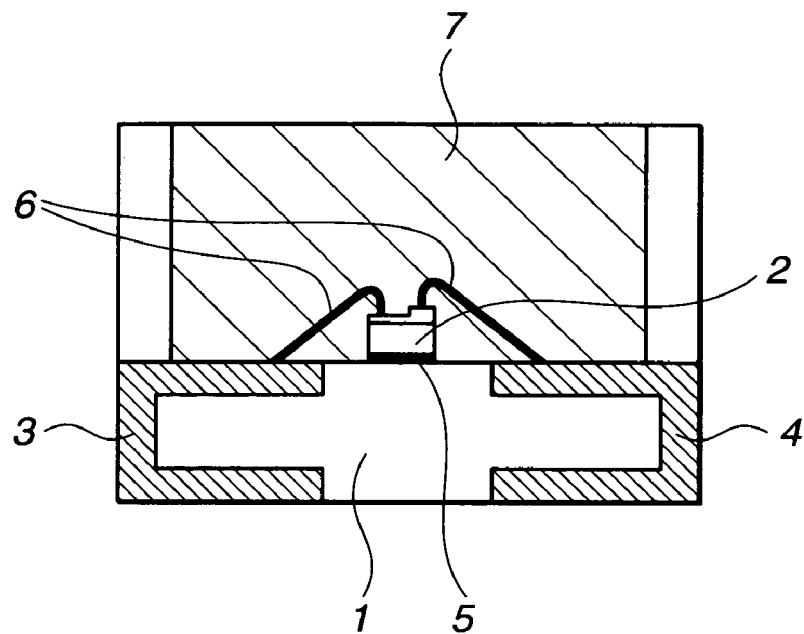
FIG. 1 is a schematic cross section of an exemplary surface mounting light-emitting semiconductor device (LED) in which a light-emitting member is die-bonded to an insulating housing.

The terms "a" and "an" herein do not denote a limitation of quantity, but rather denote the presence of at least one of the referenced item.

As used herein, the term "encapsulation" refers to embedding, sealing, coating and protecting functions and is interchangeable therewith.

One embodiment of the invention is an epoxy/silicone hybrid resin composition comprising as essential components (A) an organosilicon compound having at least one silicon-bonded hydroxyl group per molecule, (B) a modified epoxy resin which is free of a phenylene ether skeleton and has reactive hydroxyl groups wherein some or all of the hydrogen atoms of the reactive hydroxyl groups are substituted by substituted or unsubstituted monovalent hydrocarbon groups or silyl groups, and (C) an aluminum base curing catalyst. In a preferred embodiment, component (A) is (A') an organosilicon compound having at least one group containing a multiple bond capable of participating in hydrosilylation reaction and at least one silicon-bonded hydroxyl group per molecule, and the composition should comprise (D) an organohydrogenpolysiloxane and (E) a platinum group metal-based catalyst in addition to components (A'), (B) and (C).

Component A

Component (A) is an organosilicon compound having at least one silicon-bonded hydroxyl group per molecule, and preferably (A') an organosilicon compound having at least one group containing a multiple bond capable of participating in hydrosilylation reaction and at least one silicon-bonded hydroxyl group per molecule.

Suitable organosilicon compounds include organosilanes, organo(poly)siloxanes, organosilalkylenes, and organosilarylenes. Inter alia, organosilanes and organo(poly)siloxanes which can be used herein are those of the average compositional formula (2):

$$R^1_a R^2_b (HO)_c (R^3 O)_d SiO_{(4-a-b-c-d)/2} \quad (2)$$

wherein $R^1$ is each independently a substituted or unsubstituted monovalent hydrocarbon group having aliphatic unsaturation, $R^2$ is each independently a substituted or unsubstituted monovalent hydrocarbon group free of aliphatic unsaturation, $R^3$ is each independently a substituted or unsubstituted monovalent hydrocarbon group free of aliphatic unsaturation, a, b and d are 0 or positive numbers, and c is a positive number. In the case of component (A'), a>0. In the case of organosilanes, a, b and d are 0 or positive integers, and c is a positive integer, with a+b+c+d=4. In the case of organo(poly)siloxanes, a+b+c+d<4.

For each of $R^1$, $R^2$, and $R^3$, those hydrocarbon groups of 1 to 10 carbon atoms, and especially 1 to 6 carbon atoms are preferred. Specifically, typical examples of $R^1$ include alkenyl groups such as vinyl, allyl, propenyl, isopropenyl, and butenyl, acryloxy and methacryloxy groups. Typical examples of $R^2$ include alkyl groups such as methyl, ethyl, propyl, butyl, and cyclohexyl, aryl groups such as phenyl and tolyl, and aralkyl groups such as benzyl. Typical examples of $R^3$ include alkyl groups such as methyl, ethyl, propyl, and butyl, and aryl groups such as phenyl.

Typical examples of organosilanes and organosiloxanes containing a silicon-bonded hydroxyl group (i.e., silanol group) include triphenylsilanol, diphenylmethylsilanol, diphenylsilane diol, vinylphenylsilane diol, divinyldiphenyldihydroxydisiloxane, and tetramethyldihydroxydisiloxane.

Organosilanes and organo(poly)siloxanes containing a silicon-bonded hydroxyl group (i.e., silanol group) and a hydrolyzable group such as alkoxy can be prepared by (partial) hydrolysis of hydrolyzable silanes. Examples of these silanol-containing organosilanes and organosiloxanes include $CH_3(CH_3O)C_6H_5SiOH$, $CH_3(C_2H_5O)C_6H_5SiOH$, $(CH_2=CH)(CH_3O)C_6H_5SiOH$, and $C_6H_5(CH_3O)Si(OH)OSi(OH)(CH_3O)C_6H_5$.

Examples of organopolysiloxanes containing a silicon-bonded hydroxyl group (i.e., silanol group) include those containing siloxane units selected from $(CH_3)_2(OH)SiO_{1/2}$, $(CH_3)_2SiO$, $CH_3(C_6H_5)(OH)SiO_{1/2}$, $CH_3SiO_{3/2}$, $(C_6H_5)SiO_{3/2}$, $CH_3(C_6H_5)SiO$, $C_3H_7(CH_3)SiO$, $(CH_2=CH)(OH)SiO_{1/2}$, $C_6H_5(CH_2=CH)(CH_3)SiO_{1/2}$, $(CH_2=CH)(CH_3)SiO$, $(CH_2=CH)(C_6H_5)SiO$, $C_6H_5(OH)SiO$, $(CH_3)_2SiO$, $(C_6H_5)_2SiO$, $C_6H_5(CH_3)_2SiO_{1/2}$. They may further contain a minor proportion of $SiO_2$ units. Organopolysiloxanes of this type can be prepared by hydrolyzing an organochlorosilane corresponding to a particular siloxane unit, and condensing hydroxyl groups while leaving a necessary amount of hydroxyl groups.

In the event component (A) or (A') is an organopolysiloxane, it is preferred that a, b, c, and d in formula (2) are $0 \leq a \leq 0.5$, especially $0 \leq a \leq 0.25$ (provided a>0 for component (A')), $0<b \leq 2.4$, especially $0.5 \leq b \leq 2$, $0<c \leq 0.5$, especially $0.01 \leq c \leq 0.2$, $0 \leq d \leq 0.5$, especially $0 \leq d \leq 0.2$, and $0.8 \leq a+b+c+d \leq 3$, especially $1 \leq a+b+c+d \leq 2.5$.

Specifically, those organopolysiloxanes of the structure shown below are exemplary of the preferred organosilicon compounds.

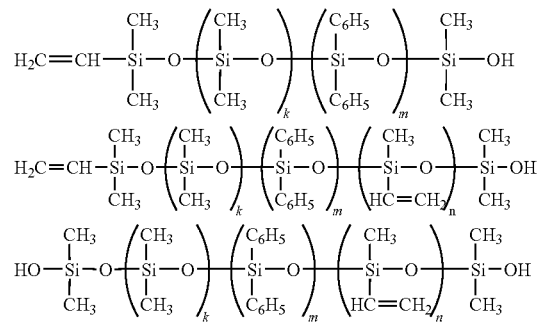

Note that k, m and n are positive integers, and the sum of k+m+n has such a value as to give a viscosity in the range defined below.

In an embodiment wherein component (A) or (A') is an organopolysiloxane, especially diorganopolysiloxane of generally linear structure, it preferably has a viscosity of about 10 to 1,000,000 mPa·s, especially about 100 to 100,000 mPa·s, as measured at 25° C. by a viscosity measurement method using a rotational viscometer of BM type. In an embodiment wherein component (A) or (A') is an organopolysiloxane of branched or three-dimensional network structure containing trifunctional siloxane units or tetrafunctional siloxane units ($SiO_2$) in the molecule, it preferably has a weight average molecular weight of about 500 to 1,000,000, especially about 1,000 to 100,000, as measured gel permeation chromatography (GPC) using polystyrene standards. Throughout the specification, the measurements of viscosity and molecular weight are as defined herein.

As indicated above, organopolysiloxanes containing silicon-bonded hydroxyl groups range from liquid to solid. For those organopolysiloxanes having a high degree of polymerization (corresponding to a viscosity of greater than or equal to 1,000 mPa·s or a weight average molecular weight of greater than or equal to 1,000), the content of silicon-bonded hydroxyl groups is preferably 0.5 to 15% by weight, more preferably 1.5 to 10% by weight. Organopolysiloxanes with a hydroxyl content of less than 0.5% by weight may be less reactive with epoxy groups whereas some organopolysiloxanes with a hydroxyl content of more than 15% by weight cannot be prepared in a consistent manner.

Besides the foregoing organosilanes and organo(poly)siloxanes, there may be used silanol-containing organosilalkylenes and organosilarylenes such as organosilethylenes and organosilphenylenes, and silanol-ontaining organosilanes and organo(poly)siloxanes having silethylene or silphenylene linkage.

Preferably the organosilicon compound as component (A) comprises an organopolysiloxane. Of the organosilicon compounds as component (A), preferred is (A') an organosilicon compound having a group containing a multiple bond capable of participating in hydrosilylation reaction, for example, an aliphatic unsaturated hydrocarbon group such as alkenyl. When compound (A') is used as component (A), the inclusion of components (D) and (E) is essential to the composition.

Component B

Component (B) is a modified epoxy resin. It is a modification of an epoxy resin which is free of a phenylene ether skeleton, for example, a phenylenoxy group derived from a bisphenol (e.g., bisphenol A or bisphenol F) or biphenyl diol used as a raw material for the epoxy resin, and has reactive hydroxyl groups, for example, hydroxyl groups located at high reactivity-providing sites in the epoxy resin, more specifically hydroxyl groups bonded to carbon in propylene groups derived from epichlorohydrin used as a raw material for the epoxy resin, for example, an epoxy resin in which all phenylenoxy groups are hydrogenated into cyclohexylenoxy groups. This epoxy resin is modified such that some or all of the hydrogen atoms of the reactive hydroxyl groups are substituted by substituted or unsubstituted monovalent hydrocarbon groups or silyl groups.

Specifically, alicyclic epoxy resins, and hydrogenated epoxy resins resulting from hydrogenation of phenylene groups on bisphenol F type epoxy resins, bisphenol A type epoxy resins or biphenyl epoxy resins are modified such that some or all of the hydrogen atoms of the reactive hydroxyl groups are substituted by substituted or unsubstituted monovalent hydrocarbon groups or silyl groups, although the modified epoxy resin is not limited thereto. Modified forms of alicyclic epoxy resins or hydrogenated epoxy resins in which some or all of the hydrogen atoms of reactive hydroxyl groups are substituted by substituted or unsubstituted monovalent hydrocarbon groups or silyl groups are preferred for preventing photo-degradation.

Inter alia, modified epoxy resins of the formula (1) are preferred.

more than 2. At least one of a number "p" of R's is a monovalent hydrocarbon group or silyl group.

The modified epoxy resins of formula (1) are arrived at by starting with unmodified epoxy resins (wherein all R's are hydrogen) and modifying them such that some or all of the hydrogen atoms of a number "p" of reactive hydroxyl groups are substituted by substituted or unsubstituted monovalent hydrocarbon groups or silyl groups. At least one of a number "p" of R's, preferably 10 to 100 mol %, more preferably 30 to 100 mol %, even more preferably 50 to 100 mol %, most preferably 70 to 100 mol % of entire R groups are modified with substituted or unsubstituted monovalent hydrocarbon groups or silyl groups. That is, among a number "p" of R's, a number from 0 to (p−1) are hydrogen atoms and the balance from p to 1 are substituted or unsubstituted monovalent hydrocarbon groups and/or silyl groups.

In formula (1), R is a hydrogen atom, a substituted or unsubstituted monovalent hydrocarbon group, glycidyl group, (meth)acrylic group or silyl group. The preferred monovalent hydrocarbon groups are of 1 to 12 carbon atoms, more preferably 1 to 8 carbon atoms. Examples include unsubstituted monovalent hydrocarbon groups, for example, alkyl groups such as methyl, ethyl, propyl, isopropyl, butyl, isobutyl, tert-butyl, pentyl, cyclopentyl, hexyl, cyclohexyl, octyl and decyl, alkenyl groups such as vinyl, allyl, propenyl, butenyl, hexenyl, and cyclohexenyl, aryl groups such as phenyl, xylyl and tolyl, and aralkyl groups such as benzyl and phenylethyl; and halo- or alkoxy-substituted monovalent hydrocarbon groups in which one or more hydrogen atoms on the foregoing unsubstituted monovalent hydrocarbon groups are substituted by halogen atoms or alkoxy groups such as chlorine, fluorine atoms or methoxy, ethoxy groups, and other substituted monovalent hydrocarbon groups in which one or more hydrogen atoms are substituted by glycidyl, (meth)acrylic, glycidoxy, (meth)acryloxy or the like.

The silyl group has the formula: —SiR'$_3$ wherein R' is each independently a substituted or unsubstituted monovalent hydrocarbon group, examples of which are as exemplified above for R. Exemplary silyl groups are vinyldimethylsilyl, trimethylsilyl, triphenylsilyl, trimethoxysilyl, and glycidoxypropyldimethylsilyl.

The modified epoxy resins are prepared, for example, by dehydrochlorination reaction of reactive hydroxyl groups on an epoxy resin with a monochlorosilane, or alcohol-removing reaction of reactive hydroxyl groups on an epoxy resin with an alkoxysilane.

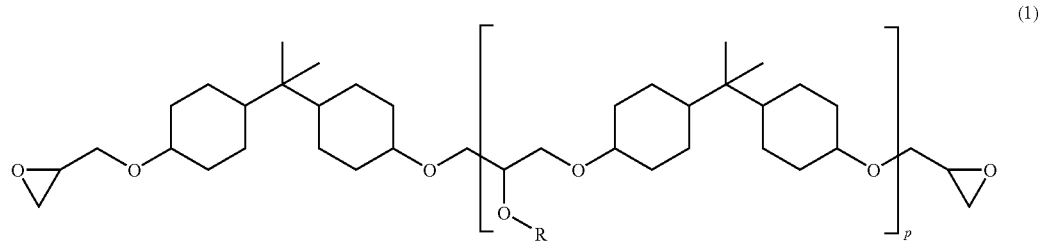

(1)

Herein, R is hydrogen, a substituted or unsubstituted monovalent hydrocarbon group, glycidyl group, (meth)acrylic group or silyl group, and p is an integer of at least 1, specifically 1 to 50, preferably 2 to 40, and more preferably 3 to 30. A number "p" of R's may be the same or different when p is equal to or In the epoxy/silicone hybrid resin composition of the invention, the modified epoxy resin (B) preferably constitutes 5 to 90% by weight based on the entire organic resins (i.e., the total of components (A) and (B), or components (A), (B) and (D)). If this proportion is less than 5 wt %, the epoxy/silicone hybrid resin composition may form a cured product with insufficient strength, allowing for the occurrence of resin cracks and adhesion failures in a thermal cycling or similar test when light-emitting semiconductor devices are encapsulated with the composition. If the proportion is more than 90 wt %, on the other hand, a cured product of the epoxy/silicone hybrid resin composition can be degraded by ultraviolet light, which is undesirable when the light-emitting device emits ultraviolet light. The more preferred proportion is 20 to 80% by weight.

Component C

Component (C) is an aluminum base curing catalyst for promoting polymerization between silanol and epoxy groups. Suitable catalysts may be either organic or inorganic aluminum compounds including aluminum trihydroxide, aluminum alcoholates, aluminum acylates, aluminum acylate salts, aluminosiloxy compounds, and aluminum chelates. The aluminum catalyst may be used in a catalytic amount, specifically in an amount of about 0.1 to 10% by weight, more preferably about 0.3 to 5% by weight based on the weight of components (A) and (B) combined. Less than 0.1 wt % of the aluminum catalyst may fail to provide a sufficient curing rate whereas more than 10 wt % may induce too fast cure, failing to manufacture a desired light-emitting semiconductor device.

Component D

Component (D) is an organohydrogenpolysiloxane which serves as a crosslinking agent for forming a cured product through addition reaction or hydrosilylation of SiH groups in component (D) with groups containing a multiple bond capable of participating in hydrosilylation reaction in component (A'), specifically aliphatically unsaturated monovalent hydrocarbon groups such as vinyl groups.

Preferred is an organohydrogenpolysiloxane represented by the average compositional formula (3):

$$H_e(R^4)_f SiO_{(4-e-f)/2} \quad (3)$$

wherein $R^4$ is each independently a substituted or unsubstituted monovalent hydrocarbon group free of aliphatic unsaturation, e and f are numbers satisfying $0.001 \leq e < 2$, $0.7 \leq f \leq 2$, and $0.8 \leq e+f \leq 3$, and having at least two, more preferably at least three silicon-bonded hydrogen atoms (i.e., SiH groups) per molecule.

In formula (3), $R^4$ is each independently a substituted or unsubstituted monovalent hydrocarbon group free of aliphatic unsaturation, preferably having 1 to 10 carbon atoms, especially 1 to 7 carbon atoms, for example, lower alkyl groups such as methyl, aryl groups such as phenyl, and those exemplified above for $R^2$ in formula (2). The subscripts e and f are numbers satisfying $0.001 \leq e < 2$, $0.7 \leq f \leq 2$, and $0.8 \leq e+f \leq 3$, preferably $0.05 \leq e \leq 1$, $0.8 \leq f \leq 2$, and $1 \leq e+f \leq 2.7$. The position of silicon-bonded hydrogen atom is not critical and may be at an end or midway of the molecule.

Examples of the organohydrogenpolysiloxane include, but are not limited to, both end trimethylsilyl-capped methylhydrogenpolysiloxane, both end trimethylsilyl-capped dimethylsiloxane-methylhydrogensiloxane copolymers, both end dimethylhydrogensilyl-capped methylhydrogenpolysiloxane, both end dimethylhydrogensilyl-capped dimethylsiloxane-methylhydrogensiloxane copolymers, tetramethyltetrahydrogencyclotetrasiloxane, pentamethyltrihydrogencyclotetrasiloxane, and tri(dimethylhydrogensiloxane)methylsilane.

Also useful is a compound of the following structure.

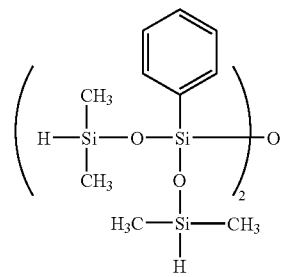

The molecular structure of the organohydrogenpolysiloxane may be either straight, branched, cyclic or network. The organohydrogenpolysiloxane can be obtained by hydrolysis of a chlorosilane such as $R^4SiHCl_2$, $(R^4)_3SiCl$, $(R^4)_2SiCl_2$, $R^4SiCl_3$, or $(R^4)_2SiHCl$ wherein $R^4$ is as defined above, and optionally equilibrating the siloxane resulting from hydrolysis.

The organohydrogenpolysiloxane (D) is compounded in an effective amount to induce curing of component (A'), that is, hydrosilylation reaction of groups containing a multiple bond capable of participating in hydrosilylation reaction. Preferably component (D) is used in such amounts that the molar ratio of SiH groups to groups containing a multiple bond capable of participating in hydrosilylation reaction in component (A'), specifically aliphatic unsaturated groups such as vinyl groups is from 0.1 to 4.0, more preferably from 1.0 to 3.0, and even more preferably from 1.2 to 2.8. A molar ratio of less than 0.1 may allow curing reaction to proceed little and make it difficult to produce cured parts. At a molar ratio in excess of 4.0, a substantial amount of unreacted SiH groups may be left in the cured composition which will change its physical properties with the passage of time.

Component E

Component (E) is a platinum group metal-based catalyst which is compounded for inducing addition cure reaction to the inventive composition. Platinum, palladium and rhodium base catalysts are included. Of these, platinum base catalysts are preferred from the economical standpoint. Specific examples include $H_2PtCl_6 \cdot xH_2O$, $K_2PtCl_6$, $KHPtCl_6 \cdot xH_2O$, $K_2PtCl_4$, $K_2PtCl_4 \cdot xH_2O$, $PtO_2 \cdot xH_2O$, $PtCl_4 \cdot xH_2O$, $PtCl_2$, and $H_2PtCl_4 \cdot xH_2O$ wherein x is a positive integer, and complexes thereof with hydrocarbons, alcohols and vinyl-containing organopolysiloxanes. They may be used alone or in admixture. The catalyst (E) may be used in a catalytic amount, specifically in an amount to give about 0.1 to 1,000 ppm of platinum group metal based on the weight of components (A'), (B) and (D) combined.

Component F

In the epoxy/silicone hybrid resin composition of the invention, (F) an adhesive aid may be optionally added for improving the adhesion of the cured composition. Suitable adhesive aids are organosilicon compounds having silicon-bonded alkoxy groups such as organosilanes and organopolysiloxanes. Examples of the organosilicon compounds include alkoxysilanes such as tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, 3-glycidoxypropyltrimethoxysilane, and 3-methacryloxypropyltrimethoxysilane as well as siloxane compounds of straight chain or cyclic structure (i.e., organosiloxane oligomers) having about 4 to about 30 silicon atoms, especially about 4 to about 20 silicon atoms, and containing per molecule at least two, preferably two or three, functional groups selected from among silicon-bonded hydrogen atoms (SiH groups), silicon-bonded alkenyl groups (e.g., Si—CH=CH$_2$), alkoxysilyl groups (e.g., trialkoxysilyl groups such as trimethoxysilyl), epoxy groups (e.g., glycidoxypropyl and 3,4-epoxycyclohexylethyl), and preferably free of a silanol group.

In a preferred embodiment, organoxysilyl-modified isocyanurate compounds having the general formula (4) and/or hydrolytic condensates thereof (i.e., organosiloxane-modified isocyanurate compounds) are used as the adhesive aid (F).

aliphatic unsaturated bond, and at least one of $R^5$ is an organic group of formula (5).

Examples of the monovalent hydrocarbon group containing an aliphatic unsaturated bond, represented by $R^5$, include alkenyl groups of 2 to 8 carbon atoms, especially 2 to 6 carbon atoms, such as vinyl, allyl, propenyl, isopropenyl, butenyl, isobutenyl, pentenyl, hexenyl, and cyclohexenyl. The monovalent hydrocarbon groups represented by $R^6$ include those of 1 to 8 carbon atoms, preferably 1 to 6 carbon atoms, for example, alkyl groups such as methyl, ethyl, propyl, isopropyl, butyl, isobutyl, tert-butyl, pentyl, hexyl and cyclohexyl, alkenyl groups such as vinyl, allyl, propenyl and isopropenyl, and aryl groups such as phenyl. Of these, alkyl groups are preferred.

Illustrative examples of the adhesive aid are given below.

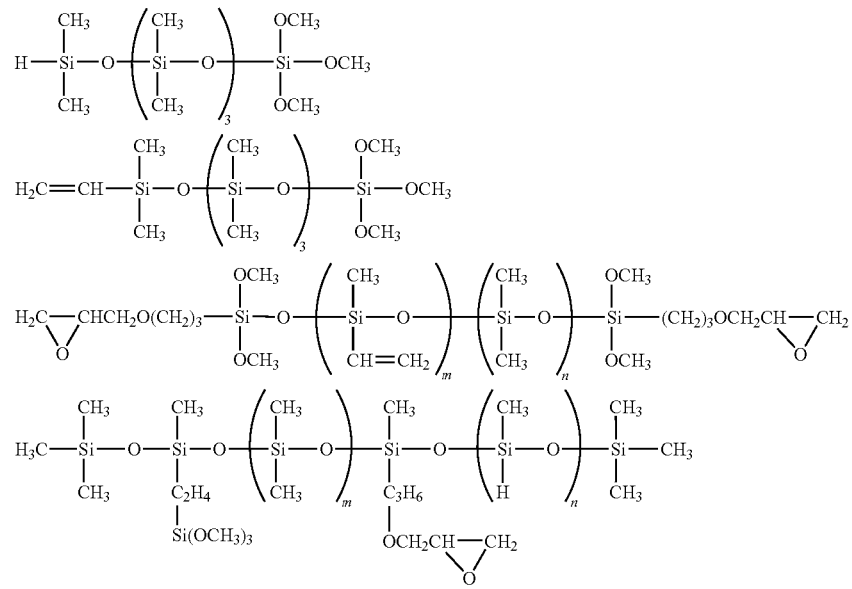

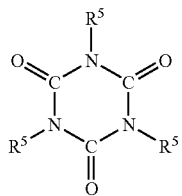

(4)

Herein $R^5$ is an organic group having the formula (5):

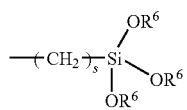

(5)

(wherein $R^6$ is hydrogen or a monovalent hydrocarbon group of 1 to 6 carbon atoms, and s is an integer of 1 to 6, especially 1 to 4) or a monovalent hydrocarbon group containing an (Subscripts m and n are positive integers satisfying m+n=2 to 50, preferably 4 to 20.)

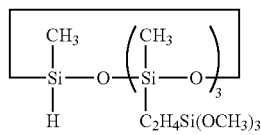

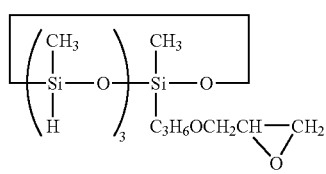

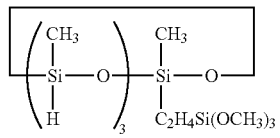

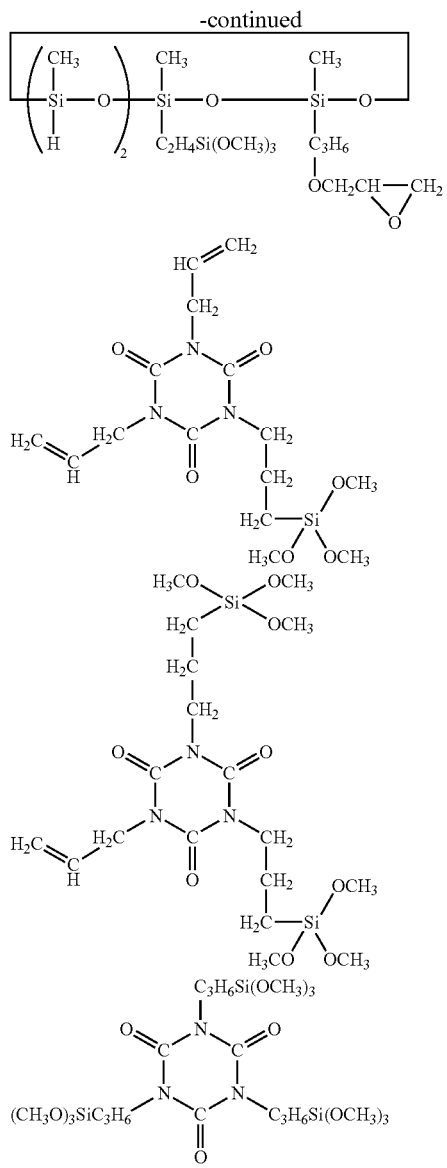

Of the organosilicon compounds, those organosilicon compounds having silicon-bonded alkoxy groups and silicon-bonded alkenyl groups or silicon-bonded hydrogen atoms (i.e., SiH groups) in a molecule are preferred because the cured compositions become more adhesive.

The adhesive aid, which is optional, may be included in an amount of up to about 10 parts by weight (i.e., 0 to 10 parts by weight), preferably about 0.01 to 5 parts by weight, more preferably about 0.1 to 1 part by weight, per 100 parts by weight of components (A) or (A') and (B) combined. Too less amounts of the adhesive aid may fail to achieve the desired effect whereas too much amounts may adversely affect the hardness and surface tack of a cured composition.

The epoxy/silicone hybrid resin composition of the invention has an adhesion strength enough to prevent peeling at the time of resin curing or IR reflow during packaging. The cured resin composition has a hardness of at least 70 in Durometer type A scale and prevents dust deposition on its surface. It has such low elasticity as to accommodate any stress produced by a difference in coefficient of thermal expansion from a ceramic or plastic housing, as demonstrated by no cracks after 1,000 cycles of a thermal shock test of cooling to −40° C. and heating to 120° C.

The epoxy/silicone hybrid resin composition can be prepared by mixing under heat components (A), (B) and (C), or (A'), (B), (C), (D) and (E) and optional components including (F) and the like. Once components (A'), (B), (C), (D) and (E) are combined together to form a composition, curing takes place even at room temperature. It is then preferable to add minor amounts of reaction inhibitors such as acetylene alcohol compounds, nitrogen compounds (e.g., triazoles, nitrile compounds) or phosphorus compounds to the composition for extending the pot-life.

In the epoxy/silicone hybrid resin composition, phosphors or light scattering agents such as microparticulate titanium oxide ($TiO_2$) may be added for wavelength alteration. As long as the objects of the invention are not compromised, other additives may be incorporated, for example, antioxidants such as BHT and vitamin B, well-known anti-discoloring agents such as organophosphorus anti-discoloring agents, anti-photo-degrading agents such as hindered amines, reactive diluents such as vinyl ethers, vinyl amides, epoxy resins other than component (B), oxetanes, allyl phthalates, and vinyl adipate, reinforcing fillers such as fumed silica and precipitated silica, flame retardance improvers, and organic solvents. Also the composition may be colored with colorants.

It is understood that the epoxy/silicone hybrid resin composition comprising components (A'), (B), (C), (D) and (E) and adapted to cure through condensation of epoxy resin in combination with hydrosilylation or addition reaction is desirable over the epoxy/silicone hybrid resin composition comprising components (A), (B) and (C) and adapted to cure solely through condensation of epoxy resin because the former is more reliable with respect to the encapsulation of optical semiconductor members, typically light-emitting semiconductor members.

When the epoxy/silicone hybrid resin composition is used for the encapsulation of light-emitting semiconductor members by a potting or injection process, the composition should preferably be liquid, with a viscosity at 25° C. being preferably in a range of 10 to 1,000,000 mPa·s, and especially 100 to 100,000 mPa·s. In the manufacture of an optical semiconductor device by transfer molding, a liquid resin composition as mentioned above may be used directly although it may be thickened, solidified and processed into pellets which are used in the transfer molding.

Figure 2:
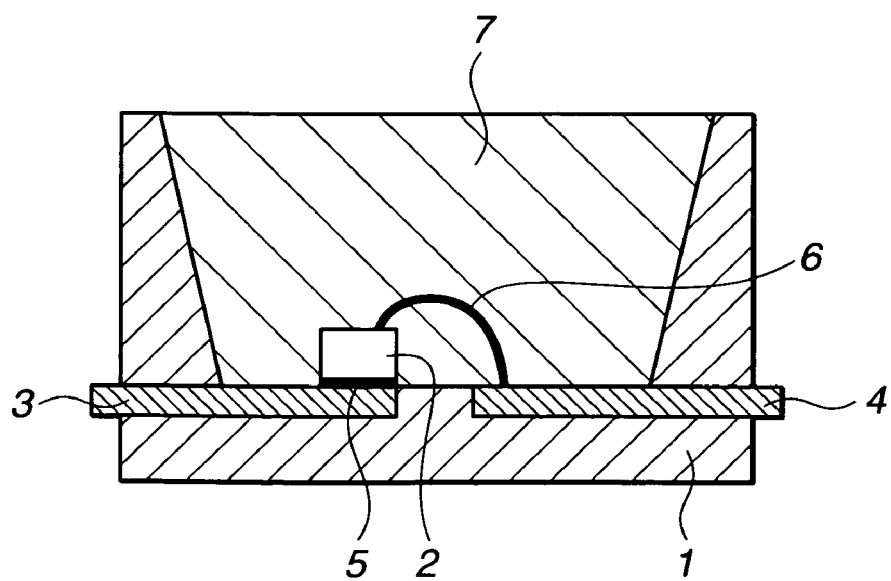
FIG. 2 is a schematic cross section of another exemplary surface mounting light-emitting semiconductor device (LED) in which a light-emitting member is die-bonded to lead electrodes inserted through a housing.
Figure 3:
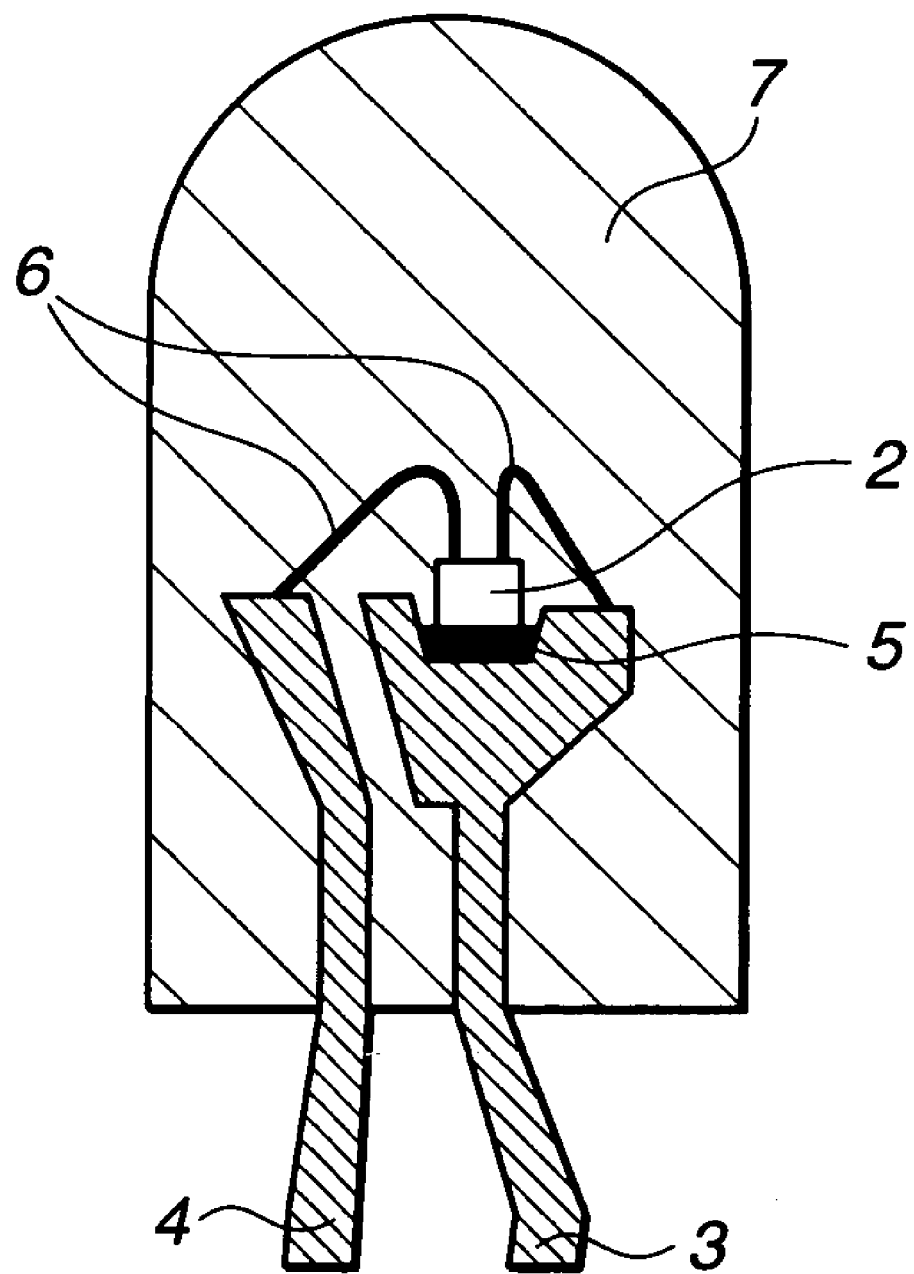
FIG. 3 is a schematic cross section of an LED as a lamp type light-emitting semiconductor device.

The epoxy/silicone hybrid resin composition of the invention is best suited for the encapsulation (embedment and protection) of optical semiconductor members, typically light-emitting semiconductor members. The light-emitting semiconductor members to which the invention is applicable include light-emitting diodes (LED), organic electroluminescent devices (organic EL), laser diodes, and LED arrays. It is not critical how to encapsulate light-emitting semiconductor members. In a typical procedure, as shown in FIGS. 1 and 2, a light-emitting semiconductor member 2 is disposed in an open interior of a housing 1, the interior is filled with an epoxy/silicone hybrid resin composition so as to surround light-emitting semiconductor member 2, and the composition is cured. The invention is also applicable to a lamp type light-emitting semiconductor device in which a light-emitting semiconductor member is embedded and protected with an encapsulant to form a bombshell shape as shown in FIG. 3. Depicted in FIGS. 1 to 3 are a housing 1, a light-emitting semiconductor member 2, lead electrodes 3 and 4, a die bonding material 5, gold wires 6, and an encapsulating material (transparent cured product of epoxy/silicone hybrid resin composition) 7. Also, LED mounted on a matrix substrate may be encapsulated by a printing, transfer molding or injection molding process.

Also the epoxy/silicone hybrid resin composition can be effectively used with semiconductors other than LED, for example, transistors, diodes, capacitors, varistors, thyristors, photoelectric conversion elements, and inter alia, optical semiconductor members such as phototransistors, photodiodes, charge coupled devices (CCD), solar cell modules, erasable programmable read only memories (EPROM), and photo-couplers.

For the inventive composition, the curing conditions may be selected from a wide range from room temperature (25° C.) to 200° C. and in accordance with working conditions. An appropriate set of conditions may be determined by taking a balance with productivity and the heat resistance of a light-emitting semiconductor member and a housing. In the event of transfer molding or injection molding, the cured product is obtained by molding at a temperature of 100 to 180° C. for a time of several tens of seconds to 5 minutes.

It is noted that the means of modifying an epoxy resin which is free of a phenylene ether skeleton and has reactive hydroxyl groups for enhancing the compatibility between an epoxy resin and a silicone resin according to the invention is also applicable to epoxy resins having a phenylene ether skeleton.

EXAMPLE

Examples of the invention are given below by way of illustration and not by way of limitation. All parts are by weight. Me is methyl, Vi is vinyl, and Ph is phenyl.

First, it is described how to evaluate compositions of Examples and Comparative Examples.

Preparation of Silicone Base Die-bonding Material

A silicone base die-bonding material was prepared by intimately mixing 100 parts of a vinyldimethylsiloxy-end-capped dimethylsiloxane-diphenylsiloxane copolymer (viscosity 3 Pa·s) having formula (I), shown below, 2.5 parts of a methylhydrogenpolysiloxane (viscosity 15 mPa·s) having formula (II), shown below, 0.03 part of a 2-ethylhexyl alcohol-modified chloroplatinic acid solution (Pt concentration 2 wt %), 0.05 part of ethynyl cyclohexyl alcohol, 7 parts of 3-glycidoxypropyltrimethoxysilane, and 400 parts of spherical alumina powder having an average particle size of 9 μm.

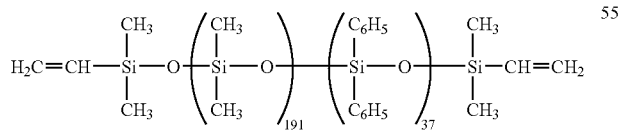

(I)

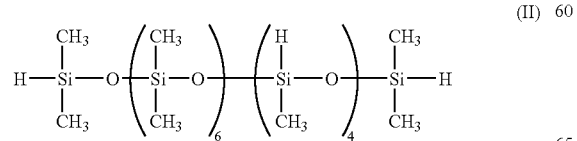

(II)

Fabrication of Light-emitting Semiconductor Device

A light-emitting semiconductor device as shown in FIG. 3 was fabricated. An LED chip including an emissive layer of InGaN and having a main emission peak at 470 nm was used as a light-emitting member 2. The light-emitting member 2 was secured to a lead electrode 3 by using a die-bonding material 5 and heating at 180° C. for 10 minutes. Gold wires 6, 6 were bonded to light-emitting member 2 and lead electrodes 3, 4 for electrical connection. An epoxy/silicone hybrid resin composition was potted and cured at 180° C. for one hour, completing a light-emitting semiconductor device in which member 2 is encapsulated with a transparent cured product 7 of the composition.

Thermal Shock Test

A thermal shock test of cooling to −40° C. and heating to 120° C. was performed 1,000 cycles on the light-emitting semiconductor device. The number of samples found to have cracked on the outer surface is reported as cracked samples/test samples.

Surface Dust Deposition

Silica powder was sprayed over the light-emitting semiconductor device whereby silica particles deposited on the surface. It was examined whether or not silica deposits on the device surface could be removed by blowing air.

Light Transmittance Change

The light transmittance of a cured composition (1 mm thick) was measured before and after holding in a 100° C. atmosphere for 1,000 hours. A retention of transmittance was calculated from the initial and final transmittances.

Example 1

An epoxy/silicone hybrid resin composition was prepared by combining 50 parts of an organopolysiloxane having the formula:

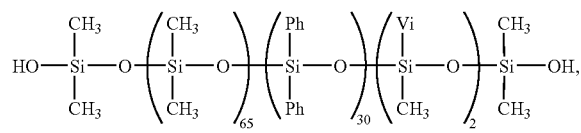

30 parts of an organopolysiloxane comprising siloxane units of the composition (in molar ratio): $(PhSiO_{3/2})_{0.6}$ $(MeSiO_{3/2})_{0.2}(ViMeSiO_{2/2})_{0.2}$ and containing 2 wt % of silicon-bonded hydroxyl groups, 20 parts of a modified epoxy resin having the formula:

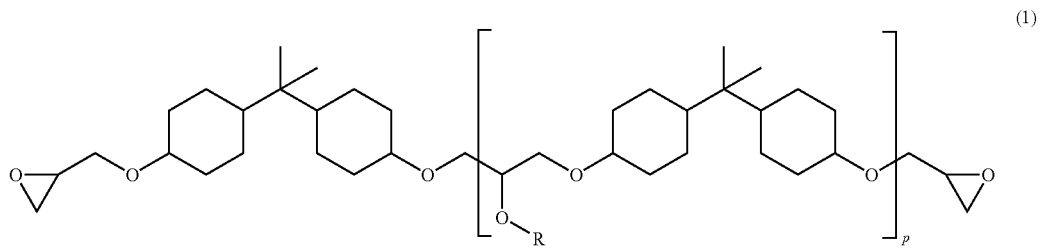

wherein R is dimethylphenylsilyl and p is 6 to 7, which was obtained by modifying an unmodified hydrogenated bisphenol A epoxy resin YL7170 (Japan Epoxy Resin Co., Ltd.), 5 parts of an organohydrogenpolysiloxane of the formula:

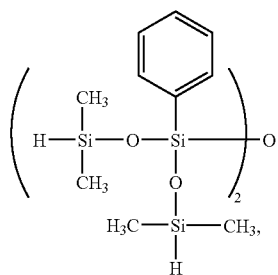

0.3 part of an adhesive aid of the formula:

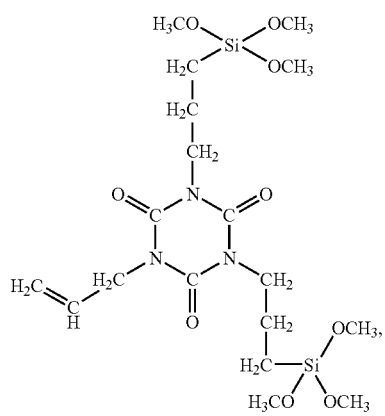

0.05 part of a platinum catalyst, and 0.1 part of aluminum acetylacetone, followed by thorough agitation.

The composition was heat molded at 150° C. for 4 hours into a cured part, which was measured for hardness (Shore D) according to JIS K6301. The composition as cured at 150° C. for 4 hours was colorless and transparent. Also, a light-emitting semiconductor device was fabricated using this resin composition and evaluated. The results are shown in Table 1.

It is noted that the modified epoxy resin was prepared as follows. The hydrogenated bisphenol A epoxy resin YL7170 was dissolved in toluene and reacted with dimethylphenylchlorosilane in an equimolar amount to the amount of hydroxyl groups on YL7170. The hydrogen chloride resulting from dehydrochlorination reaction was removed as an amine hydrogen chloride salt by filtration. The toluene solution as filtered was washed with deionized water for removing ionic impurities. The solvent was removed, yielding the desired silicone-modified epoxy resin.

Example 2

An epoxy/silicone hybrid resin composition was prepared as in Example 1 except that 80 parts of the organopolysiloxane comprising siloxane units of the composition (in molar ratio): $(PhSiO3/2)_{0.6}(MeSiO_{3/2})_{0.2}(ViMeSiO_{2/2})_{0.2}$ and containing 2 wt % of silicon-bonded hydroxyl groups was solely used in place of the two types of organopolysiloxane. Using the composition, a cured part and a light-emitting semiconductor device were similarly formed and tested. The results are shown in Table 1. The cured part was colorless and transparent.

Example 3

An epoxy/silicone hybrid resin composition was prepared as in Example 2 except that the modified epoxy resin was replaced by a modified epoxy resin having the formula:

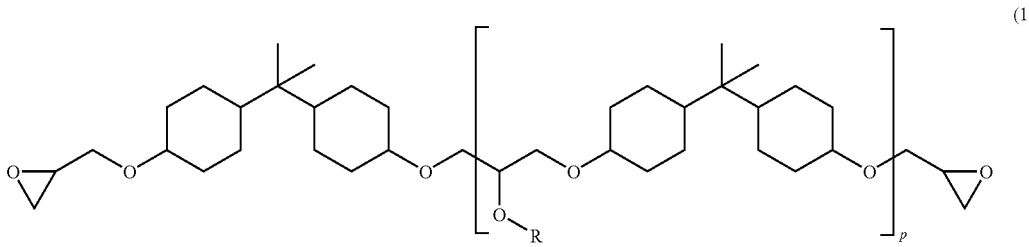

wherein R is dimethylphenylsilyl and p is 3 to 4, which was obtained by modifying an unmodified hydrogenated bisphenol A epoxy resin YL7031 (Japan Epoxy Resin Co., Ltd.). Using the composition, a cured part and a light-emitting semiconductor device were similarly formed and tested. The results are shown in Table 1. The cured part was colorless and transparent.

It is noted that the modified epoxy resin was prepared as follows. The hydrogenated bisphenol A epoxy resin YL7031 was dissolved in toluene and reacted with dimethylphenylchlorosilane in an equimolar amount to the amount of hydroxyl groups on YL7031. The hydrogen chloride resulting from dehydrochlorination reaction was removed as an amine hydrogen chloride salt by filtration. The toluene solution as filtered was washed with deionized water for removing ionic impurities. The solvent was removed, yielding the desired silicone-modified epoxy resin.

Example 4

An epoxy/silicone hybrid resin composition was prepared as in Example 2 except that the modified epoxy resin was replaced by a modified epoxy resin having the formula:

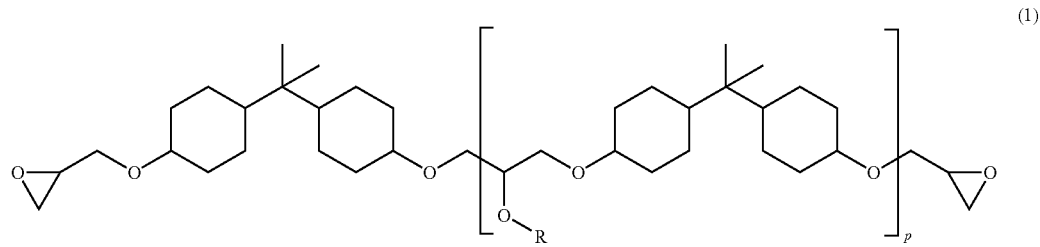

wherein R is vinyldimethylsilyl and p is 6 to 7, which was obtained by modifying an unmodified hydrogenated bisphenol A epoxy resin YL7170 (Japan Epoxy Resin Co., Ltd.) and the amount of the organohydrogenpolysiloxane was changed to 10 parts. Using the composition, a cured part and a light-emitting semiconductor device were similarly formed and tested. The results are shown in Table 1. The cured part was colorless and transparent.

It is noted that the modified epoxy resin was prepared as follows. The hydrogenated bisphenol A epoxy resin YL7170 was dissolved in toluene and reacted with vinyldimethylchlorosilane in an equimolar amount to the amount of hydroxyl groups on YL7170. The hydrogen chloride resulting from dehydrochlorination reaction was removed as an amine hydrogen chloride salt by filtration. The toluene solution as filtered was washed with deionized water for removing ionic impurities. The solvent was removed, yielding the desired silicone-modified epoxy resin.

Comparative Example 1

A composition was prepared as in Example 2 except that the unmodified epoxy resin YL7170 was used in place of the modified epoxy resin. A cured part of the composition was translucent.

Comparative Example 2

A composition was prepared as in Example 2 except that the unmodified epoxy resin YL7031 was used in place of the modified epoxy resin. Using the composition, a cured part and a light-emitting semiconductor device were similarly formed and tested. The results are shown in Table 1. The cured part was translucent.

TABLE 1

|  | Example | | | | Comparative |
| --- | --- | --- | --- | --- | --- |
|  | 1 | 2 | 3 | 4 | Example 2 |
| Resin hardness (Shore D) | 50 | 78 | 80 | 82 | 75 |
| Dust deposition | — | — | — | — | — |
| Thermal shock test, cracked samples | 0/50 | 0/50 | 0/50 | 0/50 | 30/50 |
| Transmittance retention (%) @100° C./1000 hr heating | 90 | 90 | 90 | 90 | 90 |

Japanese Patent Application No. 2005-364404 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An epoxy/silicone hybrid resin composition comprising
   (A) an organosilicon compound having at least one silicon-bonded hydroxyl group per molecule,
   (B) a modified epoxy resin which is free of a phenylene ether skeleton and has reactive hydroxyl groups wherein some or all of the hydrogen atoms of the reactive hydroxyl groups are substituted by substituted or unsubstituted monovalent hydrocarbon groups or silyl groups, and
   (C) an aluminum base curing catalyst.

2. The epoxy/silicone hybrid resin composition of claim 1, wherein the modified epoxy resin (B) has the general formula (1):

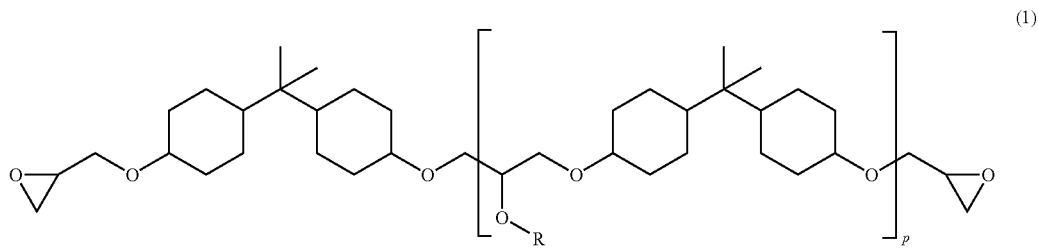

(1)

wherein R is hydrogen, a substituted or unsubstituted monovalent hydrocarbon group, glycidyl group, (meth) acrylic group or silyl group, and p is an integer of at least 1, with the proviso that a number "p" of R's may be the same or different when p is equal to or more than 2, and at least one of a number "p" of R's is a monovalent hydrocarbon group or silyl group.

3. The epoxy/silicone hybrid resin composition of claim 1, wherein component (A) is (A') an organosilicon compound having at least one group containing a multiple bond capable of participating in hydrosilylation reaction and at least one silicon-bonded hydroxyl group per molecule, and said composition further comprising (D) an organohydrogenpolysiloxane and (E) a platinum group metal-based catalyst.

4. The epoxy/silicone hybrid resin composition of claim 1, which is used for the encapsulation of optical semiconductor members.

5. An optical semiconductor device in which an optical semiconductor member is encapsulated with a transparent cured product of the epoxy/silicone hybrid resin composition comprising:

(A) an organosilicon compound having at least one silicon-bonded hydroxyl group per molecule.

(B) a modified epoxy resin which is free of a phenylene ether skeleton and has reactive hydroxyl groups wherein some or all of the hydrogen atoms of the reactive hydroxyl groups are substituted by substituted or unsubstituted monovalent hydrocarbon groups or silyl groups, and (C) an aluminum base curing catalyst.

6. The optical semiconductor device of claim 5, which is a light-emitting semiconductor device in which a light-emitting semiconductor member is encapsulated with the cured product.

* * * * *